United States Patent [19]

Oda

[11] Patent Number: 5,371,388
[45] Date of Patent: Dec. 6, 1994

[54] ELECTRON WAVE INTERFERENCE DEVICES, METHODS FOR MODULATING AN INTERFERENCE CURRENT AND ELECTRON WAVE BRANCHING AND/OR COMBINING DEVICES AND METHODS THEREFOR

[75] Inventor: Hitoshi Oda, Sagamihara, Japan

[73] Assignee: Canon Kabushiki Kaisha, Tokyo, Japan

[21] Appl. No.: 208,196

[22] Filed: Mar. 10, 1994

Related U.S. Application Data

[63] Continuation of Ser. No. 770,334, Oct. 3, 1991, abandoned.

[30] Foreign Application Priority Data

Oct. 8, 1990 [JP] Japan .................. 2-270223
Apr. 2, 1991 [JP] Japan .................. 3-096225

[51] Int. Cl.$^5$ .................. H01L 27/14; H01L 31/00
[52] U.S. Cl. .................. 257/194; 257/184; 257/280; 257/425; 257/449
[58] Field of Search .................. 257/21, 184, 187, 192, 257/194, 270, 280, 421, 425, 431, 449, 472

[56] References Cited

U.S. PATENT DOCUMENTS

| | | | |
|---|---|---|---|
| 4,734,750 | 3/1988 | Okamura et al. | 357/16 |
| 4,962,410 | 10/1990 | Kriman et al. | 357/15 |
| 4,996,570 | 2/1991 | Van Houten et al. | 357/22 A |
| 5,051,791 | 9/1991 | Baldwin et al. | 357/22 A |

FOREIGN PATENT DOCUMENTS 0381591 8/1990 European Pat. Off. .

OTHER PUBLICATIONS

Patent Abstracts of Japan, vol. 013, No. 378 (E-809) Aug. 22, 1989, and JP-A-11 29 477 (Mitsubishi Electric), May. 22, 1989.
Superlattices and Microstructures, vol. 4, No. 4/5, 1988, pp. 541-544, C. J. B. Ford et al., "Transport In GaAs Heterojunction Ring Structures."
Datta et al., Proposed Structure For Large Quantum Interference Effects, Appl. Phys. Lett., vol. 48 No. 7, Feb. 1986, pp. 487-489.

*Primary Examiner*—Sara W. Crane
*Attorney, Agent, or Firm*—Fitzpatrick, Cella, Harper & Scinto

[57] ABSTRACT

An electron wave interference device includes a source electrode for injecting electrons therethrough, a drain electrode for taking out electrons therethrough, channel means for propagating electrons from the source electrode to the drain electrode and a gate electrode provided on a halfway portion of the channel means between the source electrode and the drain electrode for dividing the channel means into plural channels solely in the halfway portion of the channel means. A positional relationship between the channel means and the gate electrode is set so that a depletion layer is extended under the gate electrode toward the channel means by applying a given voltage to the gate electrode. The depletion layer extended through the channel means forms an island which inhibits the propagation of electrons in the channel means and thus divides the channel means into the plural channels.

4 Claims, 12 Drawing Sheets

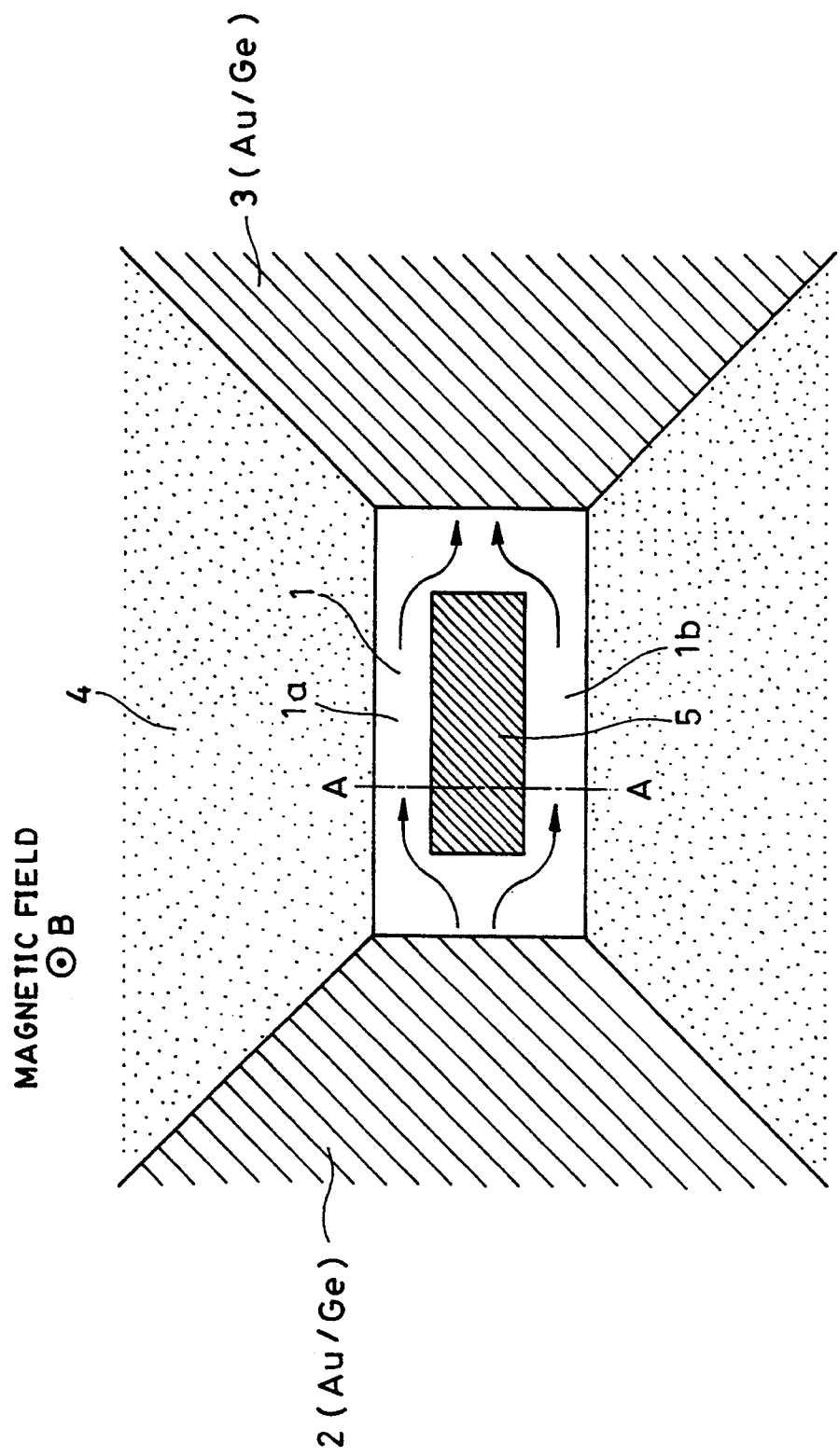

CASE WHERE GATE VOLTAGE IS CHANGED ΔV

PLANE WHERE DEPLETION LAYER INTERSECTS TWO DIMENSIONAL ELECTRON GAS WHEN GATE VOLTAGE V IS APPLIED $$\begin{cases} A = L\ell \\ \Delta A \cong 2(L+\ell)\Delta d \end{cases}$$

ELECTRON WAVE INTERFERENCE DEVICES, METHODS FOR MODULATING AN INTERFERENCE CURRENT AND ELECTRON WAVE BRANCHING AND/OR COMBINING DEVICES AND METHODS THEREFOR

This application is a continuation of application Ser. No. 07/770,334 filed Oct. 3, 1991, now abandoned.

BACKGROUND OF THE INVENTION

1. Field of the Invention

The present invention relates to an electron wave interference device for conducting a speedy switching using a low voltage, for performing a photodetection with a high sensitivity, or for other purposes, a method for modulating an interference current in an electron interference device and an electron wave branching and/or combining device and a method therefor utilizing an extension of a depletion layer through a continuously formed plane for propagating an electron wave.

RELATED BACKGROUND ART

In recent years, there is a growing need, as an information society develops, for rapidly taking in a great capacity of information and processing and transmitting it rapidly in operational processors, communication systems, memory systems and the like. There exists, for example, switching device and photodetectors as an important key device for realizing those systems.

Conventionally, a switching device of a quantum interference transistor structure has been presented which includes a pair of electron wave channels with coupled opposite ends and in which electrons are injected form one coupled end and emitted from the other coupled end. A phase difference between electron waves propagated through two channels is controlled by an external field such as an electric field or a magnetic field. The phase difference varies a degree of electron wave interference caused at the emission coupled end. As a result, a conductance of electrons or interference current is varied. Thus, the function of a transistor is achieved.

FIG. 1 shows an example of a quantum interference device for controlling an interference current by a magnetic field B. In the device, the phase difference between electron waves propagated through two channels 101 and 102 is proportional to a magnetic flux traversing an area surrounded by the two channels 101 and 102. This is due to the Aharonov-Bohm effect. Therefore, an electron wave injected from a source side arm 103 is in a state in which its phase is uniform, but the phase difference proportional to the magnetic flux occurs while the electron wave is split into two electron waves along the channels 101 and 102.

When the magnetic field of a given magnitude is applied so that the phase difference becomes an odd number multiple of $\pi$, an electron wave caused by the interference at a drain side arm 104 occupies a state of a higher energy and hence is reflected backward. In contrast, if the phase difference generated by the magnetic field is an even number multiple of $\pi$, the electron wave caused by the interference at the drain side arm 104 can pass the drain side arm 104. Thus, an output current having the same magnitude as an input current can be obtained. Therefore, a transmission factor $|T|^2$ at the output side (drain side) is given by:

$$|T|^2 = \cos^2\{e/(h/2\pi) \cdot A/2 \cdot B\} \quad (1)$$

where e is the charge of an electron, h is the Planck constant, A is an area two channels 101 and 102 surround and B is a magnitude of an external magnetic field. It is seen from the equation (1) that the conductance varies according to a periodical function of the magnetic field B as shown in FIG. 2 and that the interference current can be controlled in a range from 0% to 100% by modulating the magnetic field.

FIG. 3 shows a second prior art device in which an interference current is controlled by an electric field. Datta et al. (Purdue Univ.) proposed an electric field control type quantum interference device as shown in FIG. 3 (S. Datta et al.; Appl. Phys. Lett. 48 (1986) 487). Two GaAs quantum well layers 111 and 112 are layered with an AlGaAs barrier layer 113 being interposed therebetween. Since the thickness of the barrier layer 113 is made small at both end, a considerably tunneling occurs between the well layers 111 and 112. However, since the thickness of the barrier layer 113 is made large at its central portion, little tunneling appears at the central portion. A voltage can be applied to the central portion by a gate electrode 114, and a potential difference $\Delta V$ can be caused between the two channels 111 and 112. As a result, between wave number vectors $k_1$ and $k_2$ of electron waves traveling in the two channels 111 and 112, the following difference occurs:

$$k_1 - k_2 = e\,\Delta V/(h/2\pi)v \quad (2)$$

Similarly to the formula (1), the transmission factor is given by:

$$|T|^2 = \cos^2\{e\Delta V\,\tau_t/2(h/2\pi)\} \quad (3)$$

where $\tau_t = L/v$ is a time required for electrons to pass the central portion of the channels 111 and 112 (a portion from x=0 to x=L shown in FIG. 3) and v is the velocity of electrons. Thus, the interference current can also be controlled by an electric field.

The above-discussed two interference devices, however, respectively have the following disadvantages.

First, in the device in which an interference current is controlled by a magnetic field, since the phase difference depends solely upon the magnetic field B and the area A as seen from the formula (1), a rapid modulation of the interference current is hard to obtain while an extremely large modulation amplitude can be obtained. The reason being that an electromagnet is needed for modulation of the magnetic field B and that a modulated current should be injected into the electromagnet. As a frequency of the modulated current increases, an impedance of an electromagnet coil becomes large and at last a sufficient current cannot flow therethrough. Several tens MHz is considered to be an upper limit of the frequency, and hence the above-discussed structure could not be used in systems that require a modulation more than an order of GHz.

Second, the problem of the device that controls an interference current by an electric field is that an amplitude of modulation cannot be made great. As is seen from the formula (3), the degree of modulation depends on a time required for electrons to pass the central portion of the channels. Under the present-day technologies of fine working, it is difficult to fabricate, for example, a quantum line structure in which velocities of almost all electrons are uniform. The velocity of electrons necessarily has a distribution to some extent. Consequently, a ratio of electrons participating in the interference will decrease, so that the degree of modulation in the conductance is weakened as shown in FIG. 4.

Further, a problem common to the above-discussed two devices is that the fabrication of devices is difficult. In FIG. 1, the width of the channels 101 and 102 should be less than 0.5 μm and the length thereof should be less than inelastic scattering length (several μm). And, regrowth is needed to produce the structure as shown in FIG. 3. After the AlGaAs barrier layer 113 between two well layers 111 and 112 has been grown by the molecular beam epitaxy (MBE) process or metal organic-chemical vapor deposition (MO-CVD) process, it is then necessary to take the wafer out in the air and conduct the etching to form thick and thin portions in the barrier layer 113. At this time, oxidization and impurity absorption at the surface of the wafer will be inevitable. Therefore, the channel 111, such as a GaAs quantum well, which is to be grown on the surface of the wafer, would have a dilapidated hetero-boundary. This channel would also contain many impurities and defects. As a result, electrons which travel through that channel would be scattered and its phase would be distributed, resulting in the degradation of the on/off or modulation ratio and detection performance in the interference current.

Thus, highly fine working and growth technologies are needed to fabricate those devices. As a result, the yield will be decreased greatly.

Next, semiconductor photodetectors of a pin type, an avalanche type, a photoconduction type and the like have conventionally been presented in optical communication systems and optical memory systems.

Among them, the photoconduction type photodetector has a structure in which carriers generated by light (its photon energy: h ν) flow parallel to the layer surface as shown in FIG. 5, so that it is suitable for integration with other devices. In FIG. 5, an undoped (φ) GaAs layer 122 of 2 μm thickness, an undoped $Al_{0.3}Ga_{0.7}As$ layer 123 and 80 Å thickness which is a spacer layer, an n-type $Al_{0.3}Ga_{0.7}As$ layer 124 of 600 Å thickness which is an electron supplying layer, a two (2) dimensional electron gas 125 formed in a hetero-boundary between the layers 122 and 123 and Ge-Au electrodes 126 are formed on a semi-insulating GaAs substrate 121.

Especially, an FET type photodetector having a gate electrode 131 between a source electrode 132 and a drain electrode 133 as shown in a cross-sectional view of FIG. 6 has an advantage that a dark current can be reduced by attaining a pinch-off state by applying a negative voltage to the gate electrode 131. In FIG. 6, a depletion layer 135 and a n-type GaAs layer 136 of about 0.3 μm thickness and about $10^{17}$ $cm^{-3}$ dopant concentration are provided on a semi-insulating GaAs substrate 134. The operation of the FET photodetector is as follows.

Light (h ν) is applied to a portion between the gate electrode 131 and the drain electrode 133 of the FET device in the pinch-off state. Generated photo-carriers $i_p$ flow through a gate resistance $R_G$ as a gate current $\Delta i_G$. As a result, since the gate voltage decreases by $R_G \cdot \Delta i_G$ (absolute value), the depletion layer 135 shrinks to dissolve the pinch-off state. Hence, a drain current $\Delta i_D$ flows through an opened channel. Consequently, the drain current $\Delta i_D$ which changes by the applied light is represented by:

$$\Delta i_D = (1 + g_m \cdot R_G) \cdot \Delta i_G \tag{4}$$

where $g_m$ is a conductance.

That is, the drain current is given by a sum of a photocurrent $\Delta i_G$ and the drain current $g_m \cdot R_G \cdot \Delta i_G$ due to the shrinkage of the depletion layer 135. Therefore, the FET photodetector has a great external quantum effect (a ratio of a drain current relative to an intensity of incident light) due to an internal amplification function.

The prior art device of FIG. 6, however, has the following drawback. Namely, an operating point must be set to a pinch-off state in order to reduce a dark current. If the pinch-off state is insufficient, the device would not work smoothly since the dark current becomes too large. Conversely, if the pinch-off state is to deep, a problem appears that the pinch-off state would not be dissolved and the photocurrent could not be obtained. Therefore, it is necessary to set a gate voltage in such a manner that an S/N becomes maximum, so that a margin is extremely narrow.

SUMMARY OF THE INVENTION

An object of the present invention is to provide an electron wave interference device which can make both modulation speed and amplitude great and can easily be fabricated with a good performance.

Another object of the present invention is to provide an electron wave interference device which can be used as a photodetector having a wide range of operating points and outputting a greater photo-current than conventional FET type devices.

A third object of the present invention is to provide an electron wave branching and/or combining device and a method for branching and/or combining an electron wave which respectively have a simple structure to be easily fabricated and simple steps to be easily realized, than conventional FET type devices.

A fourth object of the present invention is to provide a method for modulating an interference current using the electron wave interference device having a above-noted structure.

According to one aspect of the electron wave interference device of the present invention, the device comprises a source electrode for injecting electrons therethrough, a drain electrode for taking out electrons therethrough, channel means for propagating electrons from the source electrode to the drain electrode and a gate electrode provided on a halfway portion of the channel means between the source electrode and the drain electrode for dividing the channel means into plural channels solely in the halfway portion of the channel means. A positional relationship between the channel means and the gate electrode is set so that a depletion layer is extended under the gate electrode toward the channel means by applying a voltage go the gate electrode. The depletion layer extended through the channel means forms an island which inhibits the propagation of electrons in the channel means and divides the channel means into the plural channels solely in the halfway portion of the channel means.

According to another aspect of the electron wave interference device of the present invention, the device includes injecting means for injecting electrons therethrough, drawing means for drawing electrons therethrough, channel means for propagating electrons from the injecting means to the drawing means and extending means for extending a depletion layer through the channel means. The channel means has a structure of a continuously-formed plane in which electrons are propagated. The extending means extends the depletion layer through the continuously-formed plane in a halfway portion of the channel means between the injecting means and the drawing means to divide the channel means into plural channels solely in the halfway portion of the channel means.

According to one aspect of the electron wave branching and/or combining device of the present invention, the device includes channel means for propagating electrons therethrough and extending means for extending a depletion layer through the channel means. The channel means has a structure of a continuously-formed plane in which electrons are propagated. The extending means extends the depletion layer through a portion of the continuously-formed plane for partially dividing the channel means into plural channels.

According to one aspect of the electron wave branching and/or combining method of the present invention, the method includes a step of providing a structure of a continuously-formed plane in which electrons are propagated and a step of extending a depletion layer through a portion of the continuously-formed plane for partially dividing the plane into plural channels.

According to one aspect of the method for modulating an interference current in the electron wave interference device having the above-mentioned structure of the present invention, includes a step of applying a constant magnetic field to the halfway portion of the channel means and a step of modulating a voltage applied to the gate electrode to change an extension of a depletion layer through the channel means under the gate electrode so that an area surrounded by the plural channels is changed. The varying area modulates an interference current detected at the drain electrode side.

According to one aspect of the method for modulating an interference current in the electron wave interference device having the above-mentioned structure of the present invention, includes a step of applying a constant magnetic field to the halfway portion of the channel means and a step of applying a modulated light to the halfway portion of the channel means to change an extension of a depletion layer through the channel means under the gate electrode so that an area surrounded by the plural channels is changed. The varying area modulates an interference current detected at the drain electrode side.

These advantages and others will be more readily understood in connection with the following detailed description, claims and drawings.

BRIEF DESCRIPTION OF THE DRAWINGS

FIG. 7 is a plan view of a first embodiment of the present invention.

DESCRIPTION OF THE PREFERRED EMBODIMENT

Figure 1:
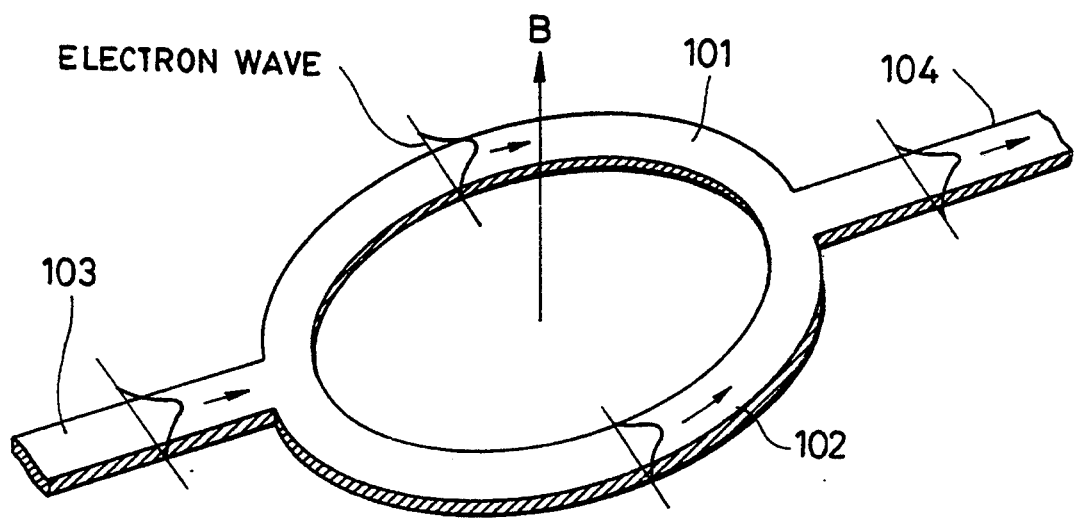
FIG. 1 is a perspective view of a first prior art device.
Figure 2:
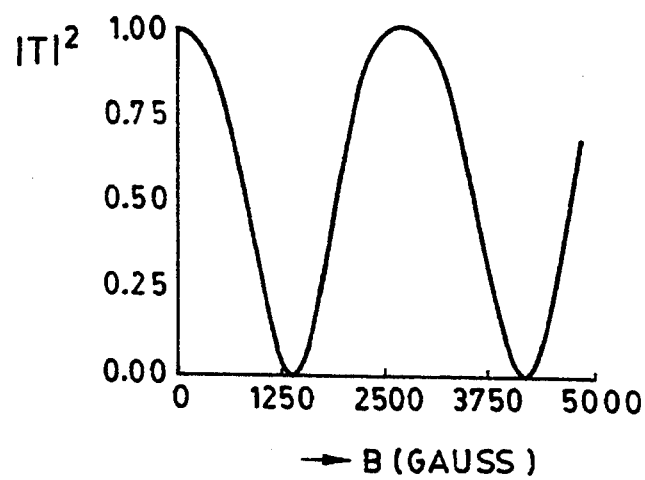
FIG. 2 is a representation illustrating the relationship between a conductance and a magnetic field in the device of FIG. 1.
Figure 3:
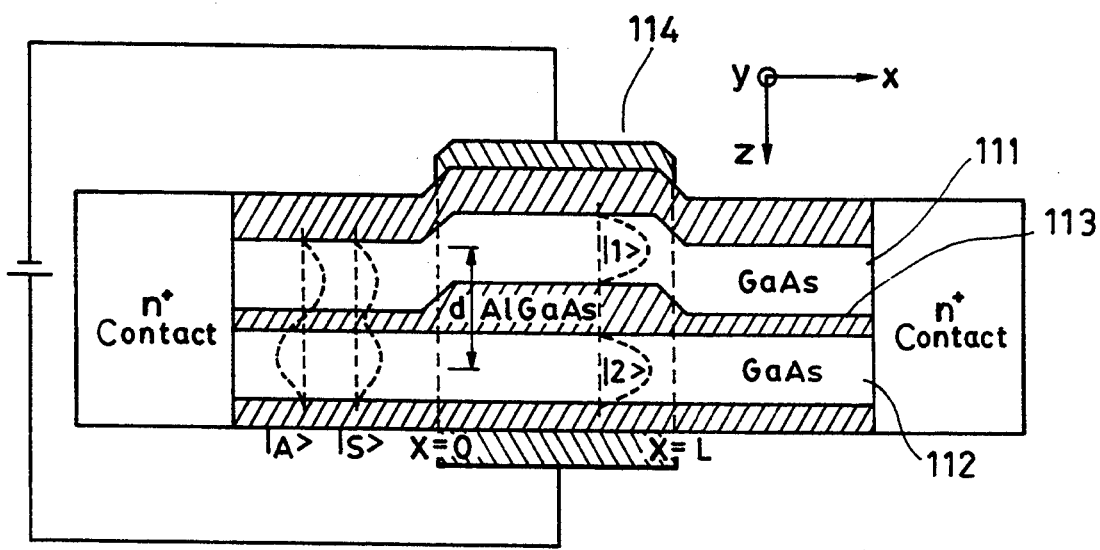
FIG. 3 is a side view of a second prior art device.
Figure 4:
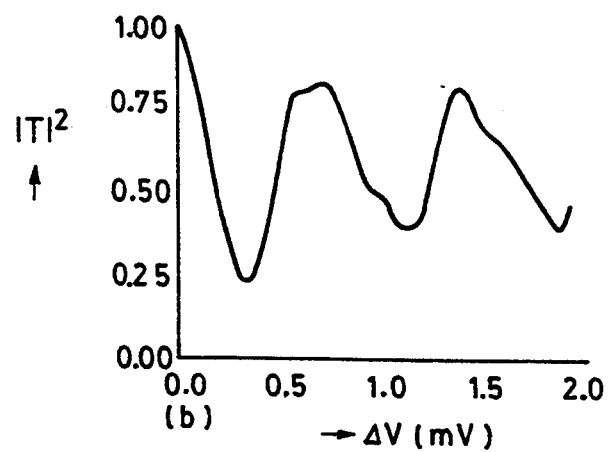
FIG. 4 is a representation illustrating the relationship between a transmission factor and a potential voltage between channels in the device of FIG. 3.
Figure 5:
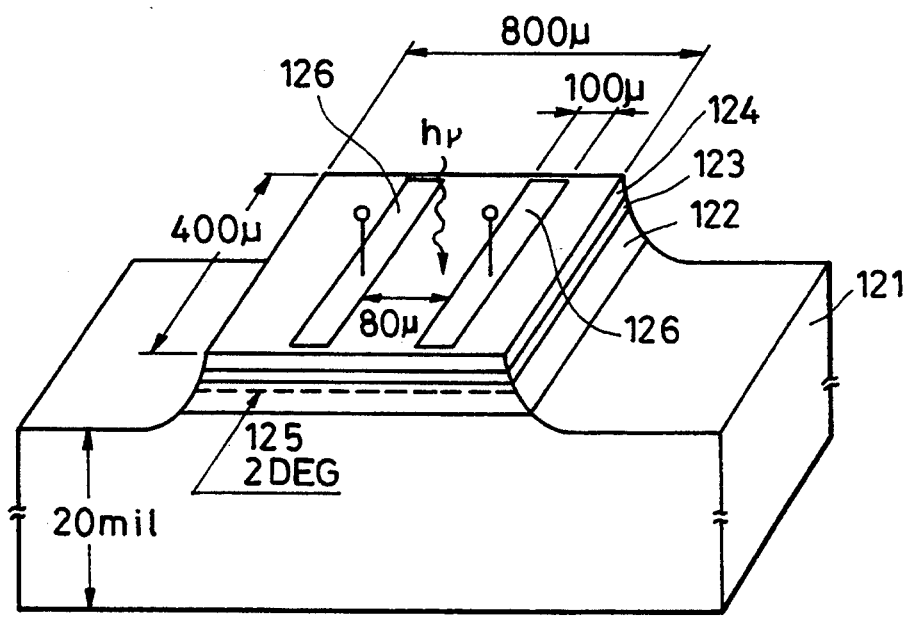
FIG. 5 is a perspective view of a third prior art device which is a photoconduction type photodetector.
Figure 6:
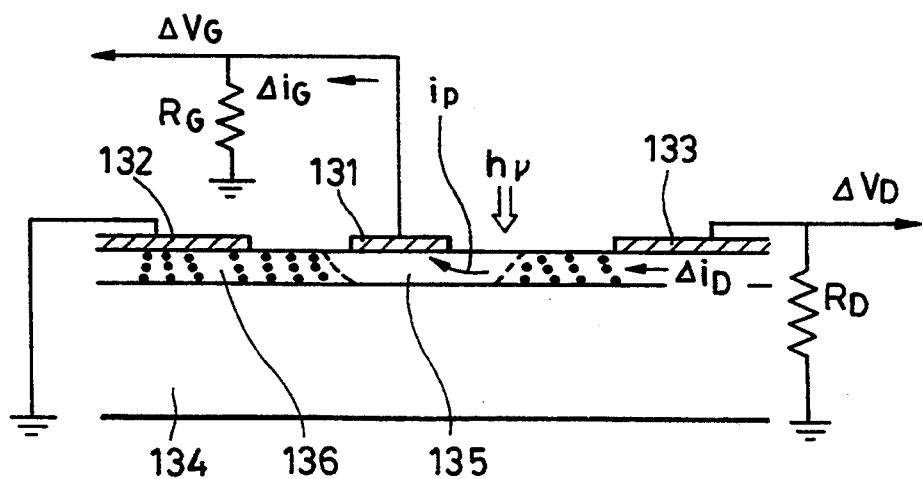
FIG. 6 is a side view for illustrating an operation principle of a fourth prior art device which is an FET type photodetector.
Figure 8A:
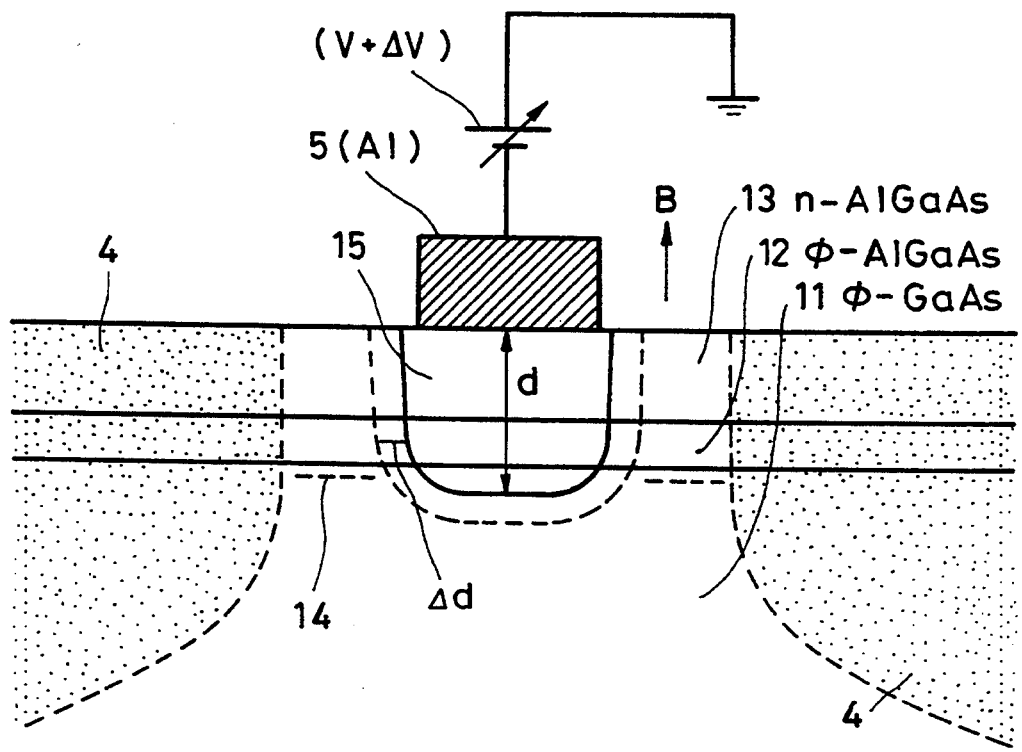
FIG. 8A is a cross-sectional view taken along an A-A' line of FIG. 7.

FIGS. 7 and 8A illustrate a first embodiment of the present invention. In FIG. 7, an elongated electron wave channel portion 1 is provided between a source electrode 2 and a drain electrode 3. The electrodes 2 and 3 are formed with Au/Ge. Except for the channel portion 1 and the electrodes 2 and 3, hydrogen ions (H+) are injected to form high resistance areas 4, and an electron wave is propagated being confined within the channel portion 1. It is, of course, possible to form the channel portion 1 by a wet etching or a reactive ion etching (RIE) instead of the ion injection. A gate electrode 5 is formed on a central portion of the channel portion 1 to divide the electron wave into two electron waves solely at a halfway thereof. A reverse bias voltage is applied to the gate electrode 5. When an external magnetic field B is applied in a direction shown in FIG. 7, a phase difference appears between electron waves traveling along divided channels $1a$ and $1b$. Thus, two electron waves interfere with each other at the side of the drain electrode 3 when they are combined.

Figure 8B:
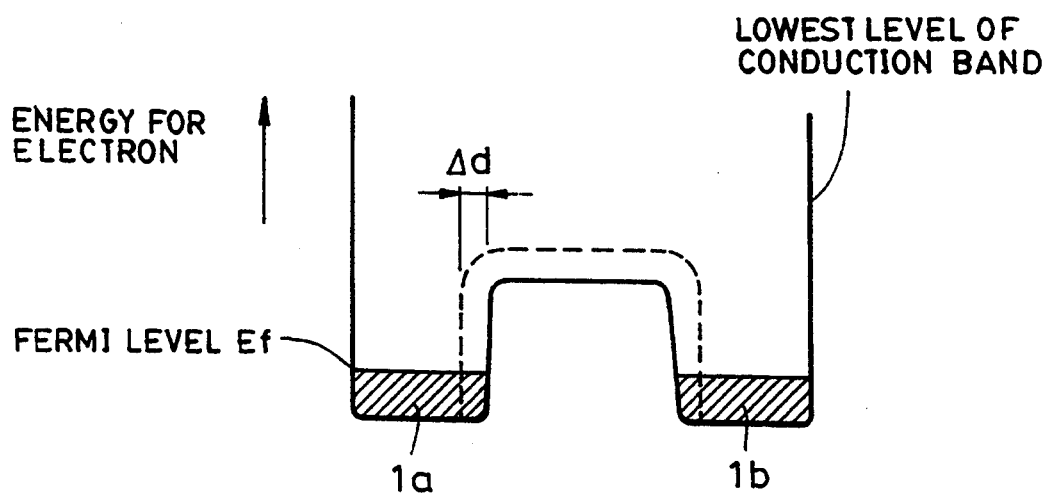
FIG. 8B is a representation illustrating an energy band structure of FIG. 8A.

FIG. 8A shows a cross-section of the device taken along a line A-A' of FIG. 7, and FIG. 8B illustrates an energy band structure of the two channels $1a$ and $1b$ and a portion therebetween. The lowest energy level of a conduction band of the portion between the two channels $1a$ and $1b$ is considerably higher than the Fermi level $E_f$, so that the electron wave cannot be propagated therethrough.

In FIG. 8A, after a $\phi$-GaAs layer 11 of 2 $\mu$m thickness is layered on a semi-insulating GaAs substrate (not shown), a $\phi$-AlGaAs layer 12 of 50 Å thickness which is a spacer layer and an n-AlGaAs 13 of 500 Å thickness which is an electron supplying layer are layered in this order and then the gate electrode 5 of Al is deposited. When an Si dopant concentration $N_d$ of the electron supplying layer 12 is set to $10^{17}$–$10^{18}$ cm$^{-3}$, electrons are swept out due to ionization and fed to a boundary between the φ-GaAs layer 11 and the φ-AlGaAs layer 12 where the energy level is a conduction band of the spacer layer 12 abruptly drops. The electrons exist at the boundary as a two dimensional electron gas 14 of about $10^{11}$ cm$^{-2}$ concentration. When a negative bias voltage V is applied to the gate electrode 5, a depletion layer 15 extends beneath the gate electrode 5. The depth d of the depletion layer 15 is given by:

$$d = (2\epsilon_s V/eN_d)^{\frac{1}{2}} \quad (5)$$

where $\epsilon_s$ is a permittivity. When the bias voltage V=5V and the Si dopant concentration $N_d \sim 10^{18}$ cm$^{-3}$, the depth becomes d=850 Å. From this, it is seen that the depletion layer 15 extends under the hetero-boundary for a total thickness of the electron supplying layer 13 and the spacer layer 12 is 550 Å. The energy band structure at this time is as shown in FIG. 8B. The channel portion 1 is divided into two channels 1a and 1b with respect to a direction normal to the electron raveling direction (a direction perpendicular to the sheet of FIGS. 8A and 8B). Thus, the structure of a quantum interference device is realized.

In the structure, consider that the voltage V of the gate 5 is changed by ΔV under a condition where a static magnetic field B is applied perpendicularly to the plane of the two dimensional electron gas 14. At this time, an amount Δd of change in the width of the depletion layer 15 is given by:

$$\Delta d = d(\Delta V/2V) \quad (6)$$

Thus, the width of the depletion layer 15 is changed when the gate voltage is varied, and the area A in the formula (1) is changed. If an amount of change in the area is ΔA, the transmission factor $|T|^2$ is represented by:

$$|T|^2 \cos^2\{e/(h/2\pi) \cdot A/2 \cdot B(1+\Delta A/A)\} \quad (7)$$

It is seen from the formula (7) that the change in the area is equivalent to a (1+ΔA/A) multiple of the magnetic field. Therefore, the modulation of the gate voltage can attain a great modulation of a current amplitude similarly to the magnetic field modulation type quantum interference device discussed above.

Figure 9:
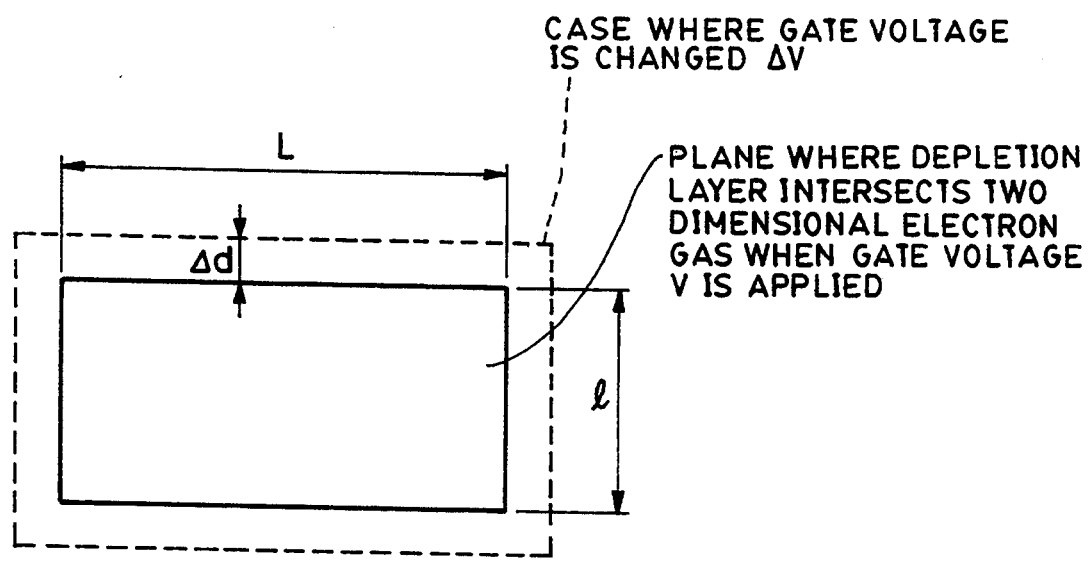
FIG. 9 is a representation illustrating a manner of change of a plane where a depletion layer intersects a plane of two dimensional electron gas when a gate voltage is changed.

Here, it is assumed that a plane (its area is A) where the depletion layer 15 intersects the two dimensional electron gas 14 when the voltage V is applied to the gate electrode 5 is simplified to be a rectangular shape A=L×l as shown in FIG. 9. When the gate voltage is changed by ΔV, the change of the area A becomes ΔA=(L+2 Δd) (l+2Δd)-Ll≈2(L+l) Δd.

Figure 10:
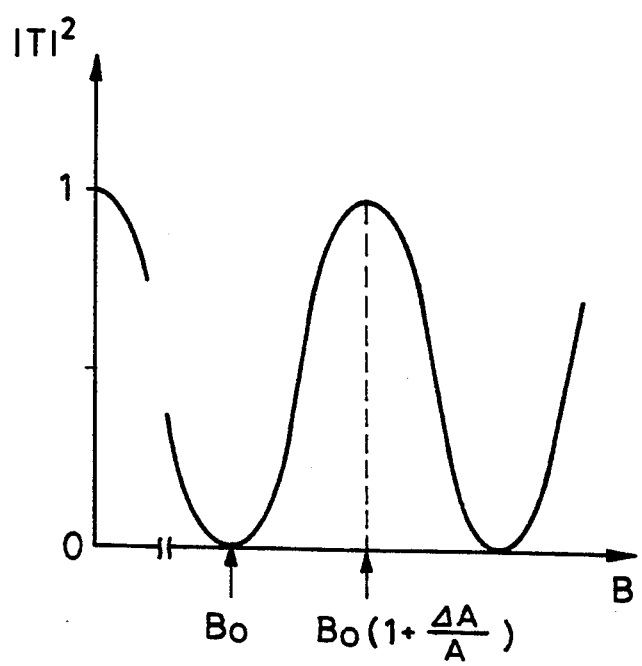
FIG. 10 is a representation illustrating the relationship between a transmission factor and a gate voltage in the first embodiment.

If the area if A=1×0.5 μm² when the applied gate voltage is 5 V, the transmission factor becomes zero as shown in FIG. 10 when the static magnetic field $B_o$ is 5.032 kG. It is obtained from the formula (7). The change ΔV of the gate voltage is obtained from the formulae (6) and (7) to be ΔV/V=2% for achieving the transmission factor of 1. That is, a 100% modulation of the interference current can be achieved only by changing the gate voltage by 100 mV.

The first embodiment can easily be fabricated because plural electron wave channels are formed only by applying a gate voltage to a flat layer structure. Further, since an amount of a magnetic flux traversing plural electron wave channels can be varied by changing the gate voltage, a high speed switching becomes possible as well as a 100% modulation. The structure can be the same as that of a conventional MES-FET, which further makes the fabrication easier.

Figure 11:
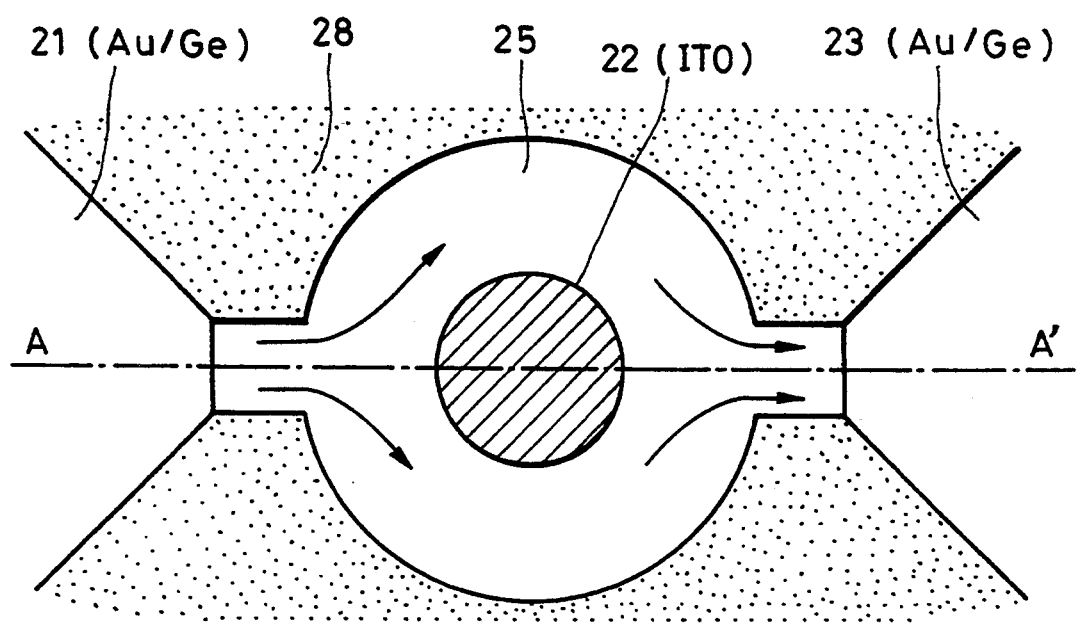
FIG. 11 is a plan view of a second embodiment of the present invention.
Figure 12:
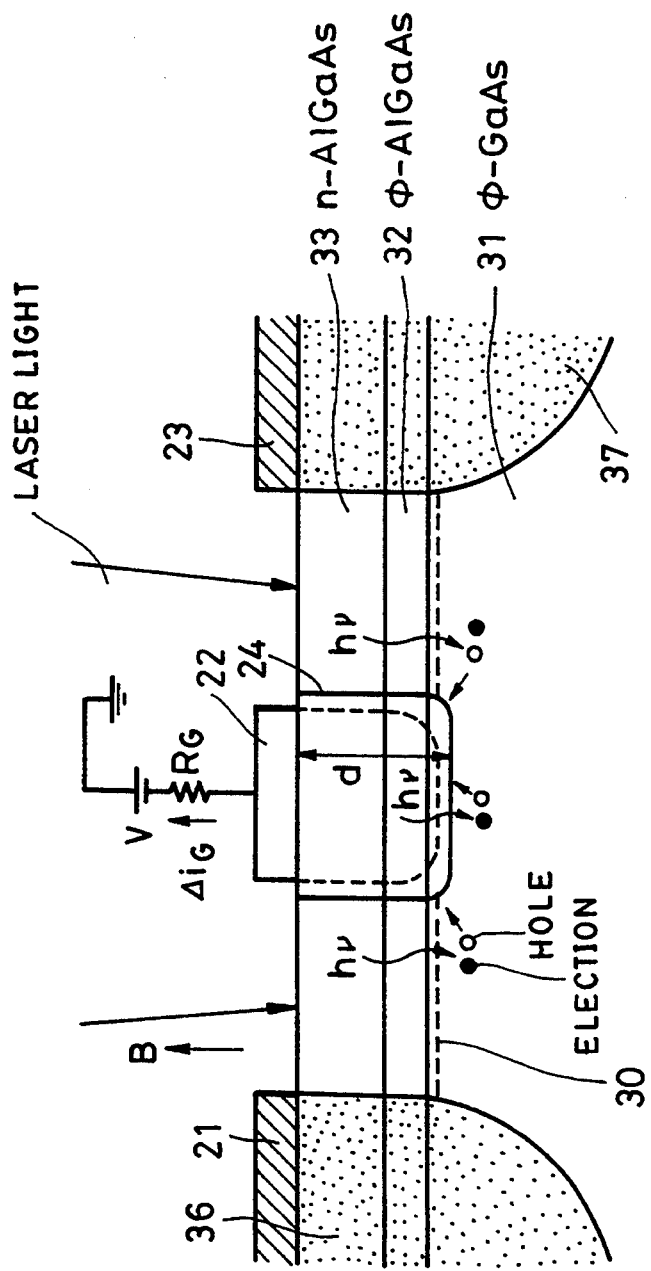
FIG. 12 is a cross-sectional view taken along an A-A' line of FIG. 11.
Figure 13:
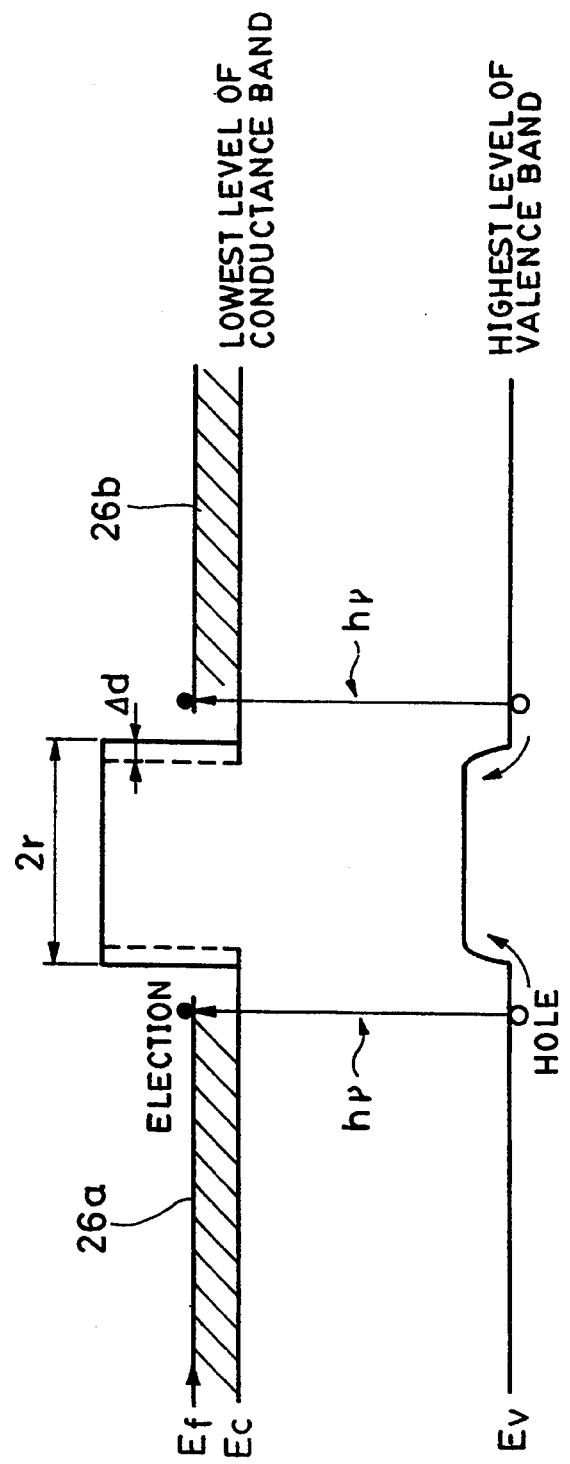
FIG. 13 is a representation illustrating an energy band structure of the second embodiment.
Figure 14:
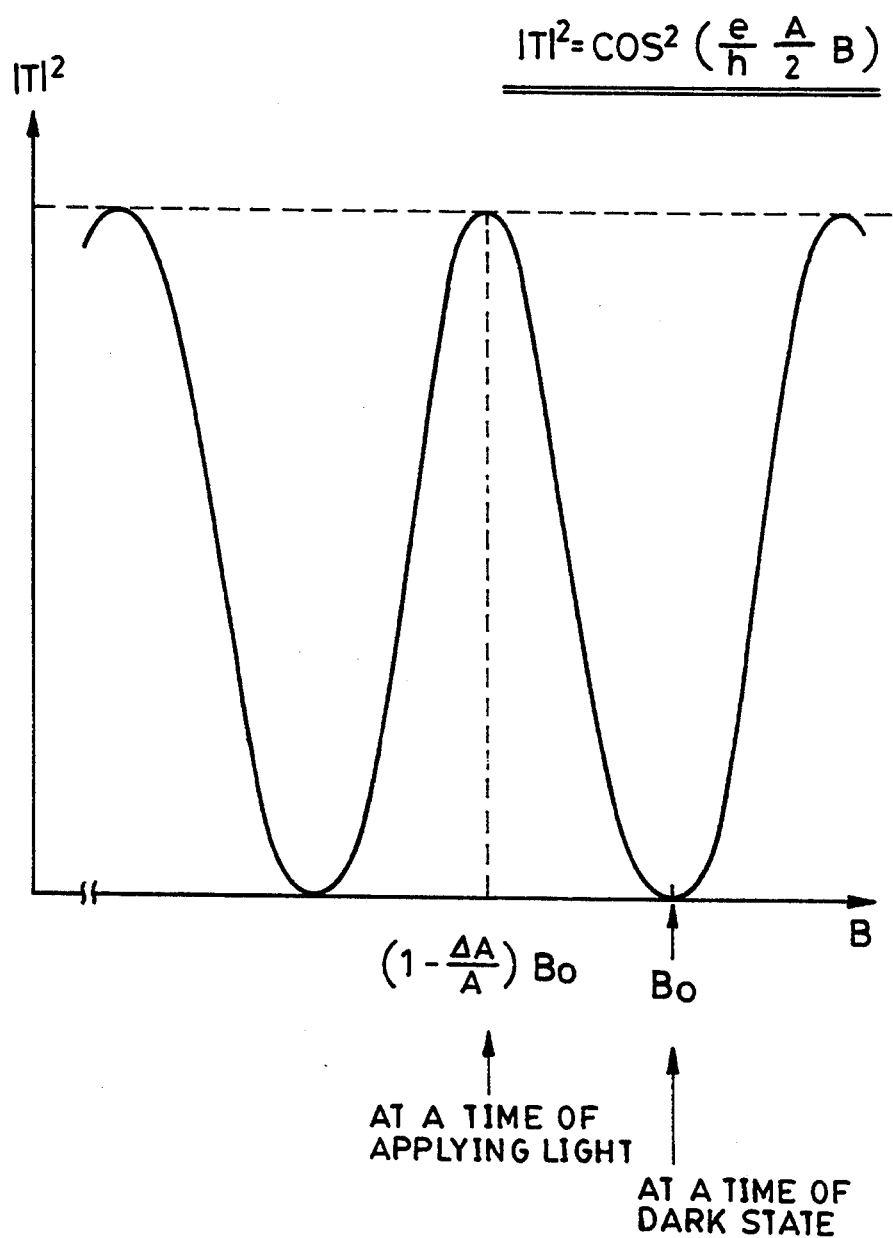
FIG. 14 is a representation illustrating the relationship between a transmission factor and a magnetic field in the second embodiment.

FIGS. 11, 12 and 13 illustrate a second embodiment of the present invention. The second embodiment is directed to a photodetector in which an electron wave interference current is changed by light. The basic operation principle thereof is the same as that of the first embodiment.

As shown in FIG. 11, a source 21, a gate 22 and a drain 23 are provided, and this three-electrode structure is the same as an ordinary FET structure. The second embodiment differs from the ordinary FET structure in that a depletion layer 24 (see FIG. 12) under the gate electrode 22 does not on-off control a channel portion 25, but changes the single-connection channel portion 25 to double-connection channels 26a and 26b (see FIG. 13 which shows an energy band structure with respect to a cross-section taken along a direction perpendicular to the A-A' line in FIG. 11). When a negative voltage is applied to the gate electrode 22, the depletion layer 24 extends thereunder as shown in FIG. 12 to create a region (hole) where no electrons exist in the single channel 25. Thus, the double-connection channel structure is obtained.

When an external magnetic field B is applied to the electron wave channels 26a and 26b, a phase difference appears between two electron waves traveling the two channels. The change of the conductance is due to the formula (1), and this is the same as with the first embodiment.

Light (photon energy; h ν) having a greater energy than a band gap energy ($E_c-E_v$) is applied to the above-discussed structure as shown in FIGS. 12 and 13. Holes out of generated photo-carriers are attracted toward the gate electrode 22 to be a photo-current $\Delta i_G$. The photo-current flows through the gate 22 and causes a voltage drop ΔV due to a gate resistance $R_G$. As a result, the depletion layer 24 shrinks as indicated by dotted lines, and the area A in the formula (1) is reduced. Thus, the conductance or drain current is changed. This is substantially the same with the first embodiment. This also means that the drain current is changed by the applied laser light and that a photodetector is attained. The device can also be utilized as a device for switching or modulating the drain current by the light.

In FIG. 11, the circular electron wave channel portion 25 is provided between the source electrode 21 and the drain electrode 23. The electrodes 21 and 23 are formed with Au/Ge. Except for the channel portion 25 and the electrodes 21 and 23, hydrogen ions are injected to form a high resistance area 28, and an electron wave is propagated being confined within the channel portion 25. It is, or course, possible to form the channel portion 25 by the wet etching or reactive ion etching (RIE) instead of the ion injection. The gate electrode 22 is formed at a central portion of the channel portion 25 to divide the electron wave into two electron waves solely at a halfway thereof.

The distance between the source electrode 21 and the drain electrode 23 should be set in such a manner that scattering (nonelastic scattering) disturbing the phase of electron wave does not exist. The distance may be as long as 10 μm where a two dimensional electron gas 30 in a hetero-boundary between a GaAs layer 31 and a AlGaAs layer 32 is used at low temperatures as in this embodiment.

In FIG. 12, after the φ-GaAs layer 31 of 2 μm thickness is layered on a semi-insulating GaAs substrate (not shown), the φ-AlGaAs layer 32 of 50 Å thickness which is a spacer layer and an n-AlGaAs 33 of 500 Å thickness which is an electron supplying layer are layered in this order and then the transparent gate electrode 22 of ITO (oxide of indium and tin) is deposited with a Schottky contact. When an Si dopant concentration $N_d$ of the electron supplying layer 33 is set to $10^{17}$–$10^{18}$ cm$^{-3}$, electrons are swept out due to ionization and fed to the boundary between the φ-GaAs layer 31 and the φ-AlGaAs layer 32 where the energy level in a conduction band of the spacer layer 32 abruptly drops. The electrons exist at the boundary as the two dimensional electron gas 30 of about $10^{11}$ cm$^{-2}$ concentration. Next, after the source electrode 21 and the drain electrode 23 are formed with an Au/Ge layer, a thermal treatment is conducted at about 400° C. to form n+-diffused regions 36 and 37.

The operation of the second embodiment is as follows. When the negative bias voltage V is applied to the gate electrode 22, the depletion layer 24 extends beneath the gate electrode 22. The depth d of the depletion layer 24 is given by the formula (5) explained in the first embodiment. When the bias voltage V=5 V and the Si dopant concentration $N_d$=$10^{18}$ cm$^{-3}$, then the depth of the depletion layer becomes d=850 Å. From this, it is seen that the depletion layer 24 extends under the hetero-boundary for a total thickness of the electron supplying layer 33 and the spacer layer 32 is 500 Å. The energy band structure at this time is as shown in FIG. 13. The channel portion 25 is divided into two channels 26a and 26b with respect to a direction normal to the electron traveling direction (a direction perpendicular to the sheet of FIG. 12). Thus, the structure of a quantum interference device is realized.

In the structure, when light of a wavelength (e.g., 0.8 μm) having a photon energy hν greater than an energy gap of the GaAs layer 31 is applied, a gate current $\Delta i_G$ flows through the gate resistance $R_G$ and a voltage drop $\Delta V = R_G \cdot \Delta i_G$ occurs. At this time, an amount $\Delta d$ of change in the depth or radius of the depletion layer 24 is given by the formula (6).

Thus, if the area A of a hole opened in the electron channel 25 by the depletion layer 24 is $A=\pi r^2$ as shown in FIG. 13 when no light is applied, the change $\Delta A/A$ of the area surrounded by the two channels 26a and 26b caused by the shrinkage $\Delta d$ of the depletion layer 24 due to the applied light is given by:

$$\Delta A/A = 2\Delta d/r \quad (8)$$

At this time, the transmission factor $|T|^2$ is represented by:

$$|T|^2 = \cos^2\{e/(h/2\pi) \cdot A/2 \cdot B(1-\Delta A/A)\} \quad (9)$$

It is seen from the formula (9) that the change in the area is equivalent to a $(1-\Delta A/A)$ multiple of the magnetic field. Therefore, if the external magnetic field is set to a value $B_o$ which makes the interference current zero when no light is applied and the depletion layer 24 is shrunk to cause the equivalent magnetic field $B_o(1-\Delta A/A)$ to make the interference current maximum, a great output can be obtained.

For instance, in FIG. 13, if the radius of the plane where the depletion layer 24 intersects the plane of two dimensional electron gas 30 is set to 0.5 μm (A=0.785 μm$^2$) and the external magnetic field $B_o$ is set to 5280 G, the transmission factor $|T|^2$ becomes zero as is seen from the formula (1). When this combination is set to an operating point at the time of a dark state, the change of the area $\Delta A/A$ becomes 0.5%.

If the gate voltage is V=5 V, the depth or radius of the depletion layer 24 is d=850 Å and the change of area is $\Delta A/A$=0.5%, the change of the gate voltage becomes $\Delta V$=147 mV as seen from the formulae (6) and (8). When the gate resistance $R_G$ and an internal quantum efficiency (a ratio of a gate current relative to an intensity of incident light) are respectively estimated to be 50 Ω and 0.5 A/W, the intensity of the applied light becomes 5.9 mV. Namely, it is understood that a 100% modulation of the interference current can be obtained by applying light of that intensity. When the intensity of light varies, an optimum condition can be attained if a combination of a different magnetic field $B_o$ and a different gate voltage V is set to the operating point.

In the photodetector of the second embodiment, the operating point can be set by one of various combinations of an external magnetic field and a gate voltage. That is, the operating point can be set in such a manner that the transmission factor given by the formula (1) becomes zero when no light is applied and that the interference current is maximized according to the intensity of light to be detected. Further, since an electron wave interference current rather than a photo-current itself is detected, a great output can be obtained. The second embodiment has substantially the same advantages as those of the first embodiment.

Figure 15:
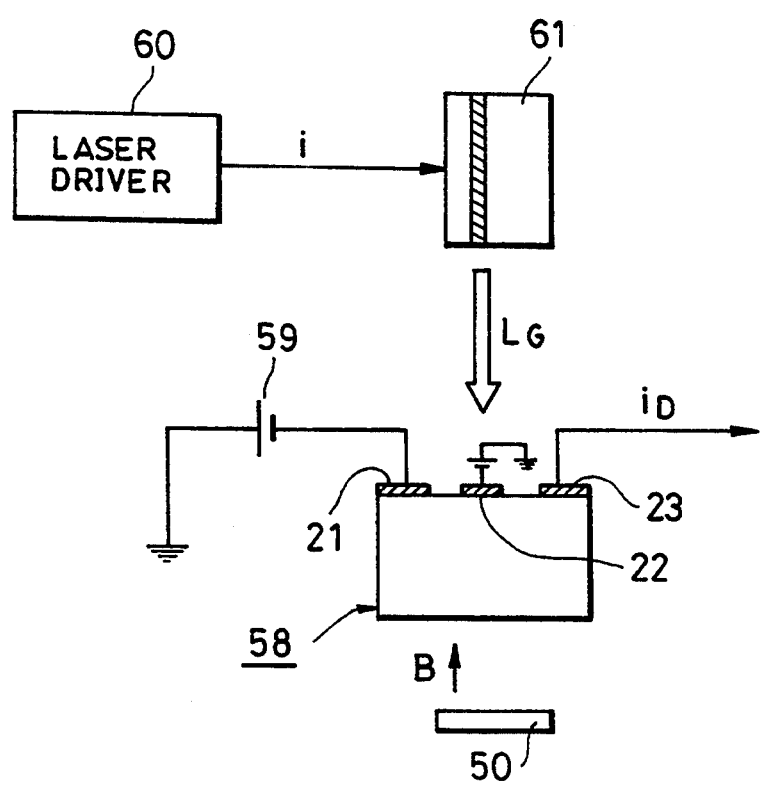
FIG. 15 is a block diagram showing an example in which the quantum interference device of the present invention is used as an optical gate transistor.

Turning to FIG. 15, a block diagram is shown illustrating an example in which the embodiment of FIG. 11 is used as an optical gate transistor. In FIG. 15, a voltage is applied by a source 59 between electrodes of a device 58 as shown in FIGS. 11 and 12. A gate light $L_G$ is also applied to this device from a laser light source 61 such as a semiconductor laser. This laser light is modulated by a current i supplied to the laser light source 61 from a laser driver 60, and thus a drain current $i_D$ is modulated in the device 58. If the gate light $L_G$ is a pulsed light whose pulse width is below 1 ps, the drain current $i_D$ can be modulated at this speed, and high-speed current modulation can be attained. In FIG. 15 a static magnetic field B is applied to the device 58 by a permanent magnet 50.

Figure 16:
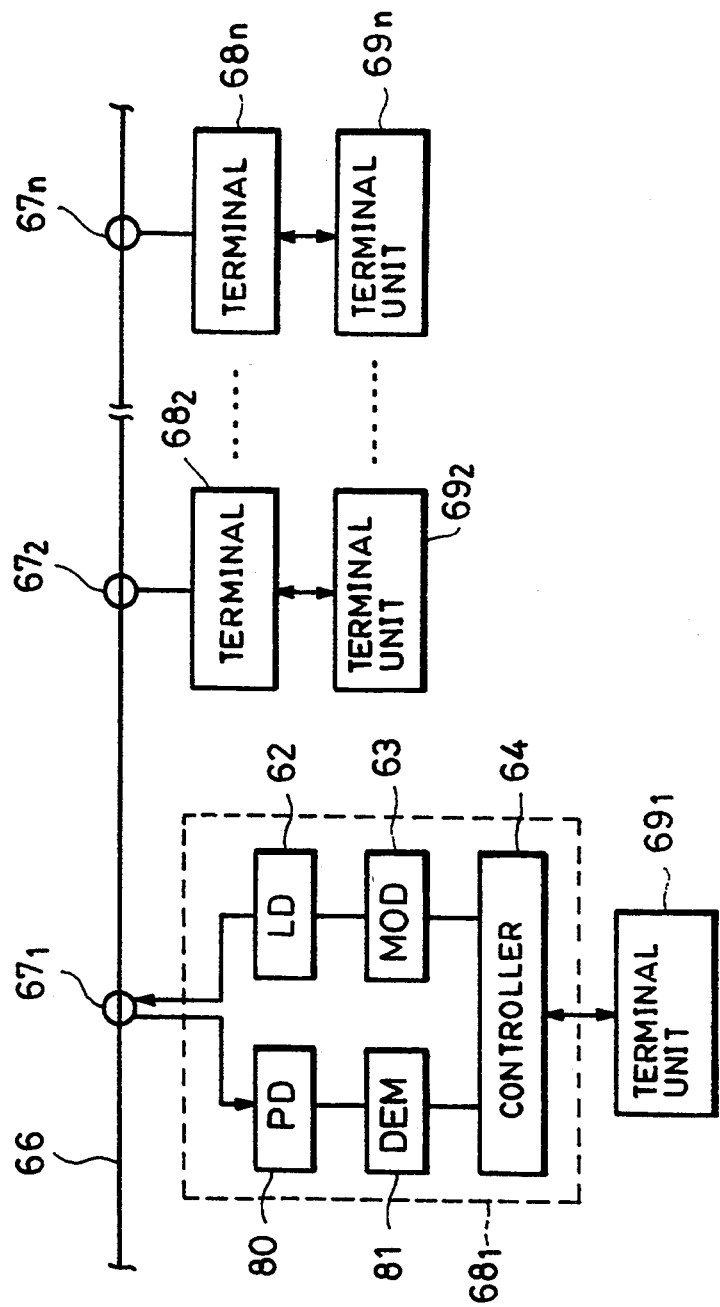
FIG. 16 is a block diagram showing an example of optical communication systems in which the quantum interference device of the present invention is used as a photodetector.

FIG. 16 shows an example in which the device mentioned above is used as a photodetector in an optical communication system. In FIG. 16, a plurality of terminals $68_1$, $68_2$, ..., $68_n$ are connected to an optical fiber 66 to transmit light signals, through optical nodes 67, $67_2$, ..., $67_n$. Connected to respective terminals are terminal units $69_1$, $69_2$, ..., $69_n$ which respectively include a keyboard, a display device and so forth. Each terminal has a light signal transmitter including a modulator circuit 63, a laser light source 62 and a light signal receiver comprising of a photodetector 80 and a demodulator circuit 81. The transmitter and receiver are controlled by a controller 64 in accordance with an instruction from the terminal unit $69_1$. The device as shown in FIGS. 11 and 12 can preferably be used as the photodetector 80.

While what are considered preferred embodiments of the present invention have been shown and described, it will be obvious to those skilled in the art that various changes and modifications may be made therein without departing from the invention as defined by the claims.

what is claimed is:

1. An electron wave interference device having an FET structure, comprising:
   a source electrode for injecting electrons therethrough;
   a drain electrode for taking out electrons therethrough;
   channel means for propagating electrons from said source electrode to said drain electrode, said channel means having a width in a direction perpendicular to a propagating direction of electrons;
   a gate electrode, having a narrower width than said channel means, provided on a halfway portion of said channel means between said source electrode and said drain electrode, and on an intermediate portion of said channel means in the direction which is perpendicular to a propagating direction of electrons for dividing said channel means into plural channels solely in the halfway portion of said channel means;
   wherein a positional relationship between said channel means and said gate electrode is set so that a depletion layer is extended under said gate electrode toward said channel means by applying a voltage to said gate electrode, thereby dividing said channel means into the plural channels solely in the halfway portion of said channel means;
   means for applying a constant magnetic field in the halfway portion of said channel means; and
   means for applying light to the halfway portion of said channel means;
   wherein the positional relationship between said channel means and said gate electrode is further set so that the extension of the depletion layer is changed under said gate electrode by changing the light applied to the halfway portion of said channel means to change an area surrounded by the plural channels, thereby changing an interference current detected at the drain electrode side.

2. An electron wave interference device according to claim 1, wherein said channel means comprises a two dimensional electron gas existing in a hetero-boundary.

3. A method for modulating an interference current in an electron wave interference device comprising a source electrode for injecting electrons therethrough, a drain electrode for taking out electrons therethrough, a channel means for propagating electrons from said source electrode to said drain electrode and a gate electrode provided on a halfway portion of said channel means between said source electrode and said drain electrode for dividing said channel means into plural channels solely in the halfway portion of said channels means, said channel means having a width in a direction perpendicular to a propagating direction of electrons and said gate electrode having a narrower width than said channel means in the direction perpendicular to the propagating direction of electrons; said method comprising the steps of:
   applying a constant magnetic field to the halfway portion of said channel means; and
   applying a modulated light to the halfway portion of said channel means to change an extension of a depletion layer through said channel means under said gate electrode so that an area surrounded by the plural channels is changed, thereby changing an interference current detected at the drain electrode side.

4. An optical communication system comprising:
   a plurality of terminals each of which has a light signal transmitter and a light signal receiver; and
   an optical fiber connected to said plurality of terminals for transmitting a light signal,
   wherein the light signal receiver in each of said terminals has a photodetector for detecting the light signal sent from the other terminals, said photodetector comprising:
   a source electrode for injecting electrons therethrough;
   a drain electrode for taking out electrons therethrough;
   channel means for propagating electrons from said source electrode to said drain electrode and having a predetermined width in a direction which is perpendicular to a propagating direction of electrons; and
   a gate electrode, having a narrower width than said channel means, provided on a halfway portion of said channel means between said source electrode and said drain electrode and on an intermediate portion of said channel means in the direction which is perpendicular to a propagating direction of electrons for dividing said channel means into plural channels solely in the halfway portion of said channel means;
   wherein a positional relationship between said channel means and said gate electrode is set so that a depletion layer is extended under said gate electrode toward said channel means by applying a voltage to said gate electrode, thereby dividing said channel means into the plural channels solely in the halfway portion of said channel means;
   means for applying a constant magnetic field to the halfway portion of said channel means;
   means for applying light to the halfway portion of said channel means; and
   the positional relationship between said channel means and said gate electrode is further set so that the extension of the depletion layer is changed under said gate electrode by changing the light applied to the halfway portion of said channels, thereby changing an interference current detected at the drain electrode side.

* * * * *

UNITED STATES PATENT AND TRADEMARK OFFICE
CERTIFICATE OF CORRECTION

PATENT NO. : 5,371,388
DATED : December 6, 1994
INVENTOR(S) : HITOSHI ODA

It is certified that error appears in the above-identified patent and that said Letters Patent is hereby corrected as shown below:

COLUMN 1

Line 23, "RELATED BACKGROUND ART" should read
--2. Related Background Art--.
Line 35, "form" should read --from--.

COLUMN 2

Line 19, "end" should read --ends-- and
"considerably" should read --considerable--.

COLUMN 3

Line 24, "distributed," should read --disturbed;--.

COLUMN 4

Line 16, "to" should read --too--.
Line 41, "a" should read --an--.

COLUMN 5

Line 27, "According to one" should read --one--.

COLUMN 6

Line 9, "two dimensional" should read --two-dimensional--.
Line 68, "layer 12" should read --layer 13--.

UNITED STATES PATENT AND TRADEMARK OFFICE
CERTIFICATE OF CORRECTION

PATENT NO. : 5,371,388
DATED : December 6, 1994
INVENTOR(S) : HITOSHI ODA

It is certified that error appears in the above-identified patent and that said Letters Patent is hereby corrected as shown below:

COLUMN 7

Line 5, "two dimensional" should read --two-dimensional--.
Line 20, "raveling" should read --travelling--.
Line 27, "two dimensional" should read --two-dimensional--.
Line 39, "$|T|^2\cos^2$" should read --$|T|^2=\cos^2$--.
Line 48, "two dimensional" should read --two-dimensional--.

COLUMN 8

Line 66, "and a" should read --and an--.

COLUMN 9

Line 66, "two" should read --two- --.

COLUMN 10

Line 59, "comprising of" should read --comprised of--.

COLUMN 11

Line 3, "what" should read --What--.
Line 43, "two" should read --two- --.

UNITED STATES PATENT AND TRADEMARK OFFICE
CERTIFICATE OF CORRECTION

PATENT NO. : 5,371,388
DATED : December 6, 1994
INVENTOR(S) : HITOSHI ODA

It is certified that error appears in the above-identified patent and that said Letters Patent is hereby corrected as shown below:

COLUMN 11

Line 54, "channels" (second occurrence) should read --channel--.

Signed and Sealed this

Ninth Day of May, 1995

Attest:

BRUCE LEHMAN

Attesting Officer

Commissioner of Patents and Trademarks